United States Patent [19]

Miyazaki et al.

[11] Patent Number: 4,890,009
[45] Date of Patent: Dec. 26, 1989

[54] MONOLITHIC INTEGRATED CIRCUIT DEVICE

[75] Inventors: Hideki Miyazaki; Kenichi Onda; Yasuo Matsuda, all of Hitachi, Japan

[73] Assignee: Hitachi, Ltd., Tokyo, Japan

[21] Appl. No.: 185,398

[22] Filed: Apr. 25, 1988

[30] Foreign Application Priority Data

Apr. 30, 1987 [JP] Japan .................................. 62-104297
Apr. 30, 1987 [JP] Japan .................................. 62-104298

[51] Int. Cl.$^4$ ..................... H03K 3/01; H03K 5/08; G05F 1/40
[52] U.S. Cl. ...................................... 307/270; 323/282; 323/284; 328/172; 328/62; 307/264; 307/300; 307/577; 361/63; 361/5
[58] Field of Search ............... 307/270, 456, 555, 577, 307/358, 300, 260, 264, 253; 328/115, 116, 117, 172, 62; 340/664; 323/282, 283, 284; 361/5, 7, 47, 52, 63

[56] References Cited

U.S. PATENT DOCUMENTS

| | | | |
|---|---|---|---|
| 4,224,535 | 9/1980 | Wilson et al. | 307/270 |
| 4,356,416 | 10/1982 | Weischedel | 307/270 X |
| 4,420,700 | 12/1983 | Fay et al. | 323/282 |
| 4,477,742 | 10/1984 | Janutka | 307/577 X |
| 4,480,201 | 10/1984 | Jaeschke | 307/577 X |
| 4,500,802 | 2/1985 | Janutka | 307/577 X |
| 4,564,769 | 1/1986 | Melamed | 307/300 |
| 4,618,814 | 10/1986 | Kato et al. | 307/353 X |
| 4,775,803 | 10/1988 | Mori | 307/300 X |
| 4,785,207 | 11/1988 | Eng | 307/577 |

OTHER PUBLICATIONS

"Smartpower provides off-line operation", Electronic Engineering, Jul. 1987, pp. 48, 49, 52, 53 and 57.

*Primary Examiner*—Stanley D. Miller
*Assistant Examiner*—Huy Kim Mai
*Attorney, Agent, or Firm*—Antonelli, Terry & Wands

[57] ABSTRACT

A monolithic integrated circuit device comprises first and second output terminals, a power switching circuit which is connected across the first and second output terminals and through which electric current is supplied to an external load from an external power source, a driving a circuit for generating a first drive signal to be supplied to the power switching circuit, and a third output terminal in electrical connection with the driving circuit for derivation of electric energy from the driving circuit as a second drive signal to be spplied to an external circuit via the third output terminal. The monolithic integrated circuit device is capable of not only controlling power supply to an external load but also driving an external circuit which may be another power switching cirtcuit cooperative with the power switching circuit in the present monolithic integrated circuit device for the purpose of controlled power supply to the external load or which may be other types of electronic circuits.

10 Claims, 6 Drawing Sheets

MONOLITHIC INTEGRATED CIRCUIT DEVICE

BACKGROUND OF THE INVENTION

The present invention relates to an integrated circuit device, and more particularly to a high blocking voltage integrated circuit device (hereinafter referred to as power IC device) in which a control circuit or driver circuit having a small current capacity and a power semiconductor device having a large current capacity co-exist.

In recent years, demands for the formation of a driver circuit for a motor or solenoid, a power source or the like in a monolithic integrated circuit configuration are remarkable. In such applications, a function of driving a power semiconductor device of a large current (not smaller than 1 A) in a compatible manner with a transistor transistor logic (TTL) is required. As means for satisfying such requirements is a power IC device in which a power semiconductor device and a control circuit or driver circuit for generating a drive signal to control the power semiconductor device is formed in a single semiconductor substrate. Merits of such a power IC device include small size, light weight and low cost owing to high density integration, and improved reliability. However, since there are problems that it is necessary to fabricate a variety of devices in small qualities since different functions are respectively required for the above-mentioned applications and that the current capacity of a power semiconductor device capable of being integrally formed together with a control circuit has a limit under the existing circumstances from the problem of increase in temperatures. In the present state, the generalization of power IC devices is difficult and hence they cannot but be designed every application. As measures to meet the increase of current capacity are considered a method of suppressing the increase of temperatures by reducing the on-resistance of a field effect transistor (MOSFET) used as a power semiconductor device and a method of using a conductivity modulation type FET such as an IGBT (Insulated Gate Bipolar Transistor) the on-resistance of which is small, thereby making it possible to reduce the chip area, as has been disclosed by, for example, Electronic Engineering, July 1987, pp. 48-57. However, the realization of these measures greatly depends on the development of such devices or components.

In the above-mentioned prior art, no consideration is paid to the generality and extensibility of power IC devices. For example, a power semiconductor device to be incorporated in a power IC device must be changed in compliance with the current capacity of a load and hence a variety of devices must be fabricated, whereby resulting in the increase of a cost. Also, there is a problem that a power semiconductor device and a control circuit must be sufficiently distanced from each other as a measure to counter the increase of temperatures, which increases the chip size.

SUMMARY OF THE INVENTION

An object of the present invention is to provide a monolithic integrated circuit (IC) device with excellent generality and extensibility which can be applied to loads having different current capacities.

According to one aspect of the present invention, a monolithic IC device is provided with a multi-output function not only for driving another semiconductor device but also for coping with various loads of different current capacities by the cooperative use of the monolithic IC device and the other semiconductor device.

According to another aspect of the present invention, a monolithic IC device comprises switching means which selectively supplies an output current to an external load (and which may comprise a power semiconductor device), driving means which performs a turn-on/turn-off control of the switching means to generate a drive signal for controlling the supply of the output current to the external load, and circuit means which is electrically connected with the driving means for deriving an electric energy as a second drive signal from the driving means.

Though the current capacity (or electric energy) of the second drive signal is small as compared with the output current supplied to the load, the second drive signal can be used as a drive signal for another semiconductor device since the points of time of generation and end thereof can be controlled by the driving means. For example, not only the monolithic IC device can be connected in parallel with the other semiconductor device to increase the capacity of a current to be supplied to the load but also the second drive signal can be used to drive the other semiconductor device, thereby improving the generality and extensibility of the monolithic IC device.

DESCRIPTION OF THE PREFERRED EMBODIMENTS

Figure 1:
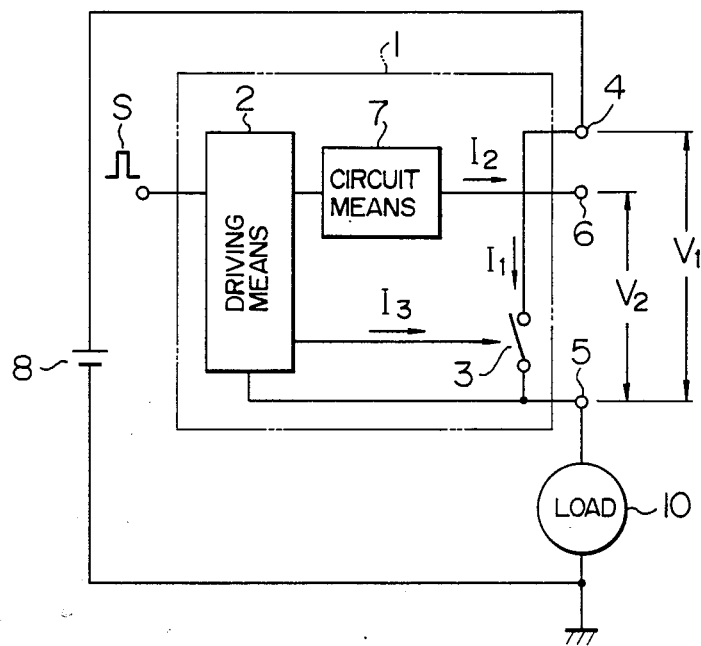
FIG. 1 is a block diagram of a monolithic IC device for explaining the principle of an operation of the present invention.

In FIG. 1, a monolithic IC device is generally represented by reference numeral 1 and is integrally formed in a single semiconductor substrate. The device 1 comprises a switching means 3, a driving means 2 which responds to an externally inputted control signal S to generate a first drive signal $I_3$ to be supplied to the switching means 3, and a circuit means 7 which is electrically connected with the driving means 2 for deriving an electric energy as a second drive signal $I_2$ from the driving means 2. The device 1 further comprises first, second and third output terminals 4, 5 and 6. The switching means 3 is connected across the first terminal 4 which may be connected with an external power source 8 and the second terminal 5 which may be connected with an external load 10. The switching means 3 responds to the first drive signal $I_3$. The switching means 3 may be a bipolar transistor, an MOS transistor or the like. The switching means 3, the external power source 8 and the external load 10 form a closed circuit. The switching means 3 becomes its ON state when the first drive signal $I_3$ is applied thereto and takes its OFF state when the first drive signal is not applied. A current $I_1$ is one which is supplied to the external load 10 through the switching means 3 in its ON state, and a voltage $V_1$ represents one which is developed across the switching means 3 when the potential of the terminal 5 is taken as a reference potential. The second drive signal $I_2$ through the circuit means 7 is outputted from the third terminal 6 to the exterior of the device 1.

A voltage $V_2$ represents the voltage of the terminal 6 when the potential of the terminal 5 is taken as the reference potential. The current $I_2$ is a signal (or current) which may be supplied from the terminal 6 toward the terminal 5 by virtue of the voltage $V_2$.

Next, the operation of the device shown in FIG. 1 will be explained with reference to FIG. 2 which shows time charts of the above-mentioned external control signal S, first drive signal $I_3$, output current $I_1$, second drive signal $I_2$, voltage $V_1$ and voltage $V_2$.

In a period of time from instants $t_1$ to instant $t_2$ and a period of time from $t_3$ to $t_4$, the driving means 2 delivers a first drive signal $I_3$ to the switching means 3 in response to the external control signal S to turn the switching means 3 on so that a current $I_1$ flows from the terminal 4 to the terminal 5. The high and low level periods of the first drive signal $I_3$, which has an approximately rectangular waveform, may be arbitrarily determined. During the high level period of the first drive signal $I_3$ in which the switching means 3 is turned on, a second drive signal $I_2$ is outputted from the terminal 6. Namely, the signals $I_2$ and $I_3$ appear in phase with each other at the terminal 6.

Explaining this relation in conjunction with voltages $V_1$ and $V_2$ for the output current $I_1$ and the second drive signal $I_2$, in a period from $t=0$ to $t=t_1$ in which the first drive signal $I_3$ is not applied, the switching means 3 is in its OFF state to block a power source voltage $V_0$ externally applied between the terminals 4 and 5. Assume that this state is a high level of the voltage $V_1$. On the other hand, the voltage $V_2$ is approximately zero or in a low level since the current $I_2$ is not produced from the circuit means 7.

Next, when the first drive signal $I_3$ is applied (or takes a high level) to turn the switching means 3 on, the voltage $V_1$ is lowered to the on-voltage $V_{on}$ of a power semiconductor device which forms the switching means 3. This state corresponds to a low level of the voltage $V_1$ At this time, the voltage $V_2$ has a magnitude or potential difference which is enough to cause the flow of the second drive signal $I_2$. Namely, the voltage $V_2$ takes a high level state.

Figure 2:
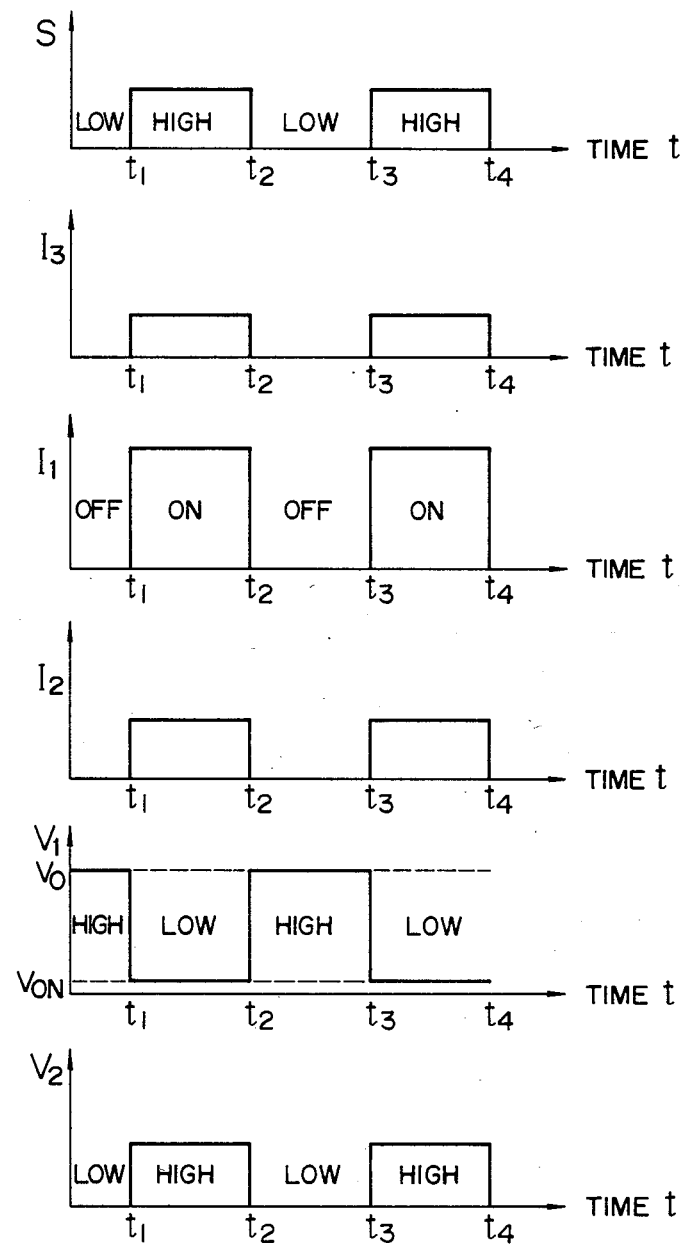
FIG. 2 is time charts for explaining the operation of the device shown in FIG. 1.

As shown in FIG. 2, the output current $I_1$ and the second drive signal $I_2$ or the voltages $V_1$ and $V_2$ are substantially synchronous in phase with each other. The voltage $V_2$ is small as compared with the voltage $V_1$ which has in its high level state a magnitude of the power source voltage $V_0$. Namely, the voltage $V_2$ is in a level of internal signal voltages of the driving means 2 even at the high level state of the voltage $V_2$. The current $I_2$ which can flow by the application of the voltage $V_2$ in the high level state, is a current in a signal level and is small as compared with an allowed value of the output current $I_1$ which can flow through the switching means 3.

Figure 3:
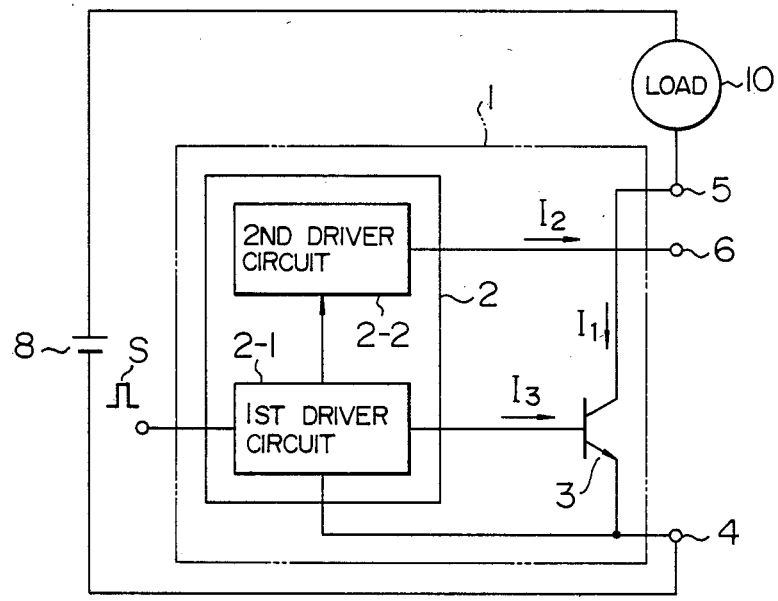
FIGS. 3 to 8 are block diagrams showing various embodiments of the present invention.

FIG. 3 shows an embodiment of the present invention. In the shown embodiment, the driving means 2 of FIG. 1 includes a first driver circuit 2-1 for receiving an external control signal S to generate a first drive signal $I_3$, and a second driver circuit 2-2 for generating a second drive signal $I_2$ with the same phase as the first drive signal $I_3$ in response to the operation of the first driver circuit 2-1. An electrical conductor between the second driver circuit 2-2 and the third output terminal 6 constitutes the circuit means 7 of FIG. 1.

In the embodiment shown in FIG. 3, the switching means 3 of FIG. 1 is constructed by an NPN bipolar transistor and the first drive signal $I_3$ is supplied to the base of the transistor. The collector and emitter of the transistor are connected with the first and second output terminals 5 and 4, respectively. Reference numeral 10 designates an external load. The configuration of a closed circuit formed by the external power source 8 (or a positive pole side thereof), the load 10 and the IC device 1 in this order of connection, as shown in FIG. 3, is called a "low side switch" configuration. On the other hand, the configuration of a closed circuit having a power source (or a positive pole side thereof), an IC device and a load connected in the mentioned order is called a "high side switch" configuration which is used for a lamp of a vehicle, a solenoid, etc. In the example of the "low side switch" configuration shown in FIG. 3, the second drive signal (or current) $I_2$ flows between the terminal 6 and the terminal 4 which corresponds to one of the opposite sides of the switching means 3 having a lower potential. The present invention is applicable to the "low side switch" configuration as well as the "high side siwtch" configuration.

Figure 4:
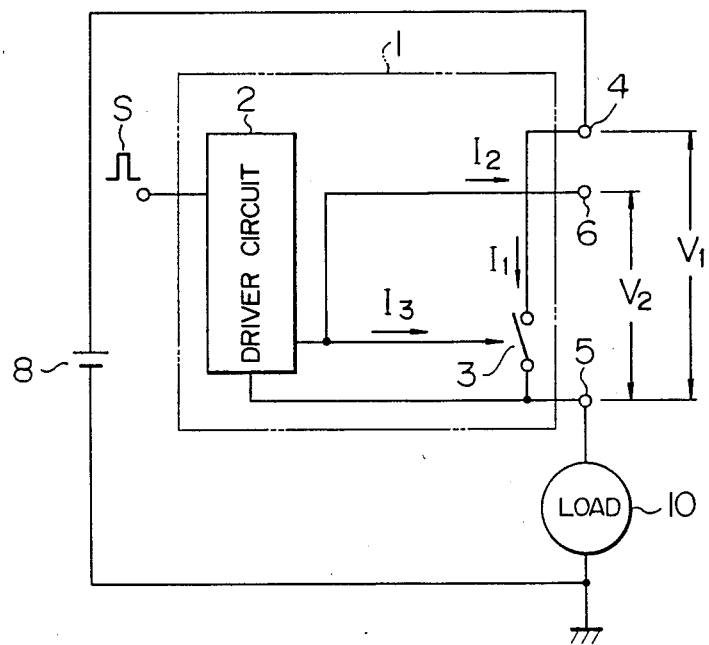

FIG. 4 shows another embodiment of the present invention. In the present embodiment, the driving means 2 of FIG. 1 is constructed by a single driver circuit. A part of the output of the driver circuit 2 generated in response to an external control signal S is supplied as a first drive signal $I_3$ to the switching means 3 while the other part thereof is supplied as a second drive signal $I_2$ to the third output terminal 6. In the present embodiment, the circuit means 7 of FIG. 1 is constructed by an electrical conductor which introduces a part split from the output of the driver circuit 2 as the second drive signal $I_2$ to the third output terminal 6.

Figure 5:
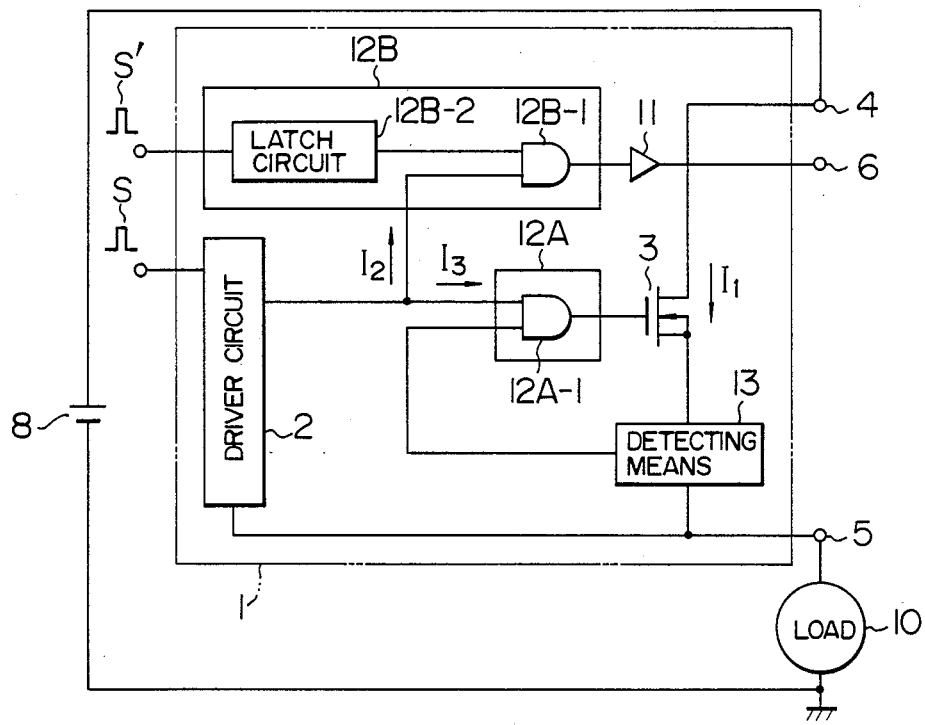

FIG. 5 shows still another embodiment for obtaining the functions explaining in conjunction with FIG. 2. In the embodiment shown in FIG. 5, an MOSFET capable of being driven by a voltage signal is used as the switching means 3. In the embodiment of FIG. 3, the driving means 2 has been constructed by the separately provided first and second driver circuits 2-1 and 2-2 and the second drive signal $I_2$ is outputted by the second driver circuit 2-2. In the embodiment of FIG. 5, the driving means 2 is constructed by a single driver circuit and a voltage signal (or first drive signal) $I_3$ for driving the switching means 3 is split from the output of the driver circuit 2, like the embodiment of FIG. 4. In FIG. 5, the driver circuit 2 generates, in response to an externally inputted control signal S, a drive signal for turning the switching means 3 on or off. A detecting means 13 detects a current $I_1$ flowing through the switching means 3 to generate a switch-open signal for turning the switching means 3 off when the current $I_1$ becomes equal to or exceeds a predetermined value. A part $I_3$ split from the output signal of the driver circuit 2 and the output signal of the detecting means 13 are applied to two inputs of a first switch circuit 12A (for example, an AND circuit 12A-1) which in turn supplies its output to the gate of the MOSFET 3. The other part $I_2$ split from the output signal of the driver circuit 2 is applied to an input of a second switch circuit 12B (for example, an AND circuit 12B-1). The second switch circuit 12B further includes a latch circuit 12B-2 which produces an output signal having a continued high or low level in response to an externally inputted control signal S'. The output signal of the latch circuit 12B-2 is applied to another input of the AND circuit 12B-1. As a result, when both the output of the driver circuit 2 and the output of the latch circuit 12B-2 take their high levels, a voltage appears at the third output terminal 6, thereby allowing the delivery of the second drive signal $I_2$. Namely, the ON/OFF control of $I_2$ can be made by the control signal S' or the AND circuit 12B-1 has a function as a kind of switch. The AND circuit 12A-1, too, has a function as a switch. The AND circuit 12A-1 is provided for controlling the points of time of the generation and end of the voltage signal (first drive signal) $I_3$ which is to be supplied to the MOSFET 3, and the AND circuit 12B-1 is provided for controlling the points of time of the generation and end of the second drive signal $I_2$ which is to be outputted from the third terminal 6. When both the switch circuits 12A and 12B are in their ON states, the first and second drive signals $I_3$ and $I_2$ are synchronous with or in phase with each other.

An amplifying means 11 is provided for coping with the case where the second drive signal $I_2$ split from the output (or common drive signal) of the driver circuit 2 is small or for avoiding any interference from the exterior. The amplifying means 11 may be constructed by a buffer. The constructions of the first and second switch circuits 12A and 12B are not limited to those shown in FIG. 5. The switch circuit 12A may have any construction which gates the detection signal from the detecting means 13 and the first drive signal $I_3$, and the switch circuit 12B may have any construction which gates the second drive signal $I_2$ in response to the control signal S'. A circuit means for supplying the second drive signal $I_2$ to the third terminal 6 includes the second switch circuit 12B, an electrical conductor between the switch circuit 12B and the terminal 6, and an electrical conductor between the output line of the driver circuit 2 and the switch circuit 12B.

The detecting means 13 having a function of detecting a current flowing through the switching means 3 to provide the detection signal to the first switch circuit 12A can be realized by, for example, means disclosed in U.S. Pat. No. 4,553,084 to Wrathall issued on Nov. 12, 1985. When the current flowing through the switching means 3 exceeds a predetermined value or an overcurrent occurs, the detecting means 13 causes the inversion of the state of the AND circuit 12A-1 to stop the application of the drive voltage or first drive signal $I_3$ to the MOSFET 3. As a result, the MOSFET 3 becomes its OFF state and the current $I_1$ being supplied to the load 10 is cut off. However, the voltage signal output from the driver circuit 2 continues and hence the outputting of the second drive signal $I_2$ is continued. Thus, the first and second drive signals $I_3$ and $I_2$ are in phase with each other but can be separately controlled by providing the first and second switch circuits 12A and 12B. In place of the detecting means 13 may be provided means which is disposed in the vicinity of the switching means 3 for detecting the surrounding temperature of the switching means 3 or heat generated by the switching means 3 so that a detection signal is generated in response to the occurrence of an overcurrent in the output current $I_1$ or the increase of the surrounding temperature of the switching means 3 up to a value equal to or higher than a predetermined temperature and is applied to the first switch circuit 12A.

Next, explanation will be made of embodiments in which a power conversion device including the IC device according to the present invention is used for driving another semiconductor device and the generality and extensibility of the IC device are improved by using the power conversion device together with the other semiconductor device.

Figure 6:
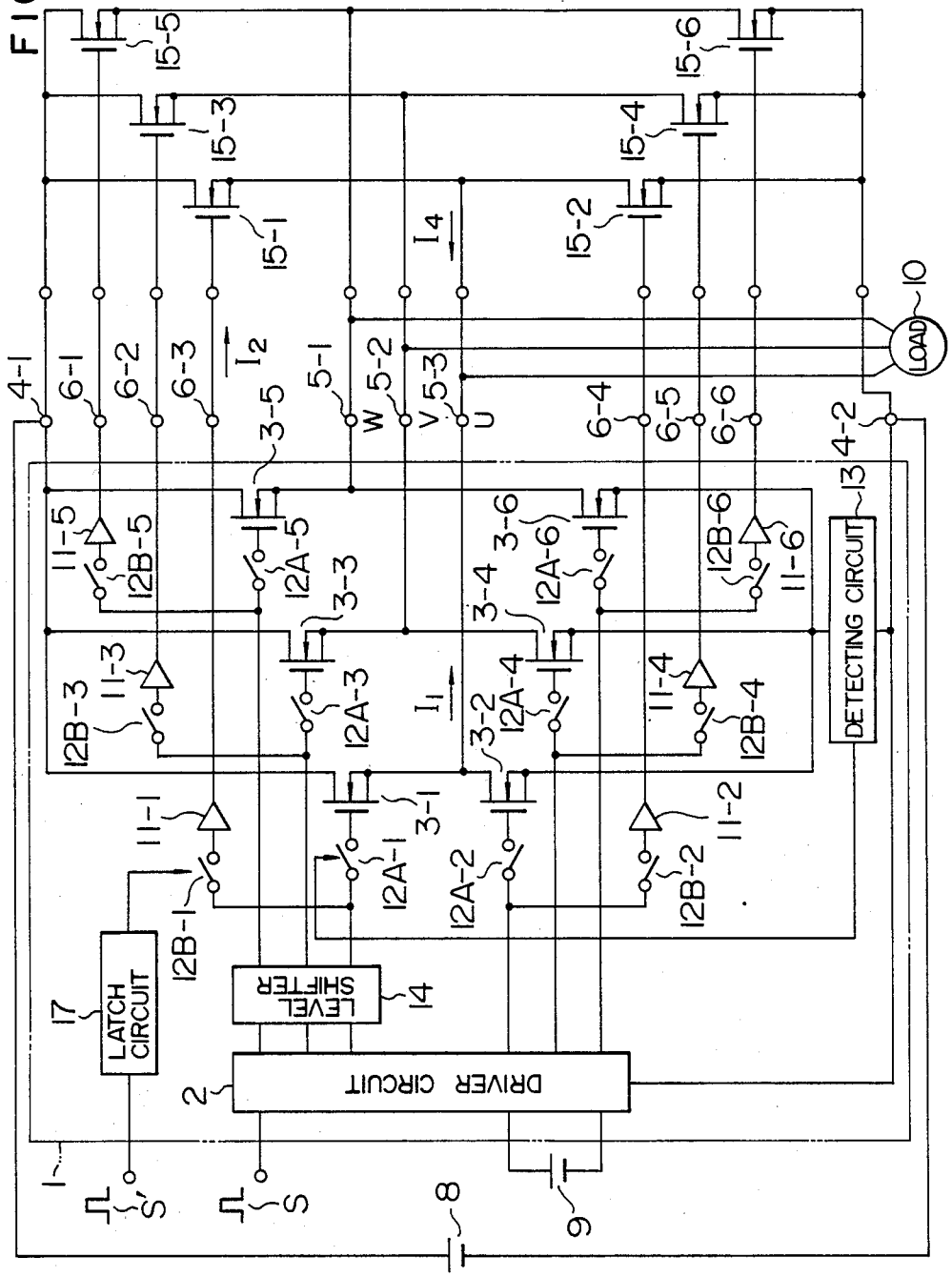

FIG. 6 shows an embodiment in which a power conversion device including a construction similar to that of FIG. 5 is used for directly driving other semiconductor devices 15-1 to 15-6. In FIG. 6, MOSFETs 3-1 to 3-6 are connected in a three-phase inverter configuration. Since a plurality of switching means are thus provided, third terminals 6-1 to 6-6 are provided with the number as that of the switching means and second drive signals are outputted from the respective terminals. In the MOSFETs of each phase, a reference potential for the second drive signal is different depending on which of the switching means in each of an upper group of switching means 3-1, 3-3 and 3-5 and a lower group of switching means 3-2, 3-4 and 3-6 is in an ON state. The value of the reference potential is also different in the MOSFETs of different phases. A level shifter 14 is provided for giving different reference potentials to the first or voltage drive signals for the respective MOSFET and the second drive signals.

Semiconductor devices (MOSFETs 15-1 to 15-6 in the present embodiment) driven by the second drive signals, too, are connected in a three-phase inverter configuration. The MOSFETs 15-1 to 15-6 are supplied with the second drive signals split from the first drive signals for the MOSFETs 3-1 to 3-6 so that the MOSFETs 15-1 to 15-6 can operate in parallel with the MOSFETs (or switching means) 3-1 to 3-6 which exist in the IC device 1 at positions corresponding to the MOSFETs 15-1 to 15-6 in terms of phase and upper or lower group.

The MOSFETs 15-1 to 15-6 may be a monolithic IC device integrally formed in a single semiconductor substrate or may be formed in individual semiconductor substrates.

Each of the MOSFETs 15-1 to 15-6 driven by the second drive signals may have a large current capacity as compared with each of the MOSFETs 3-1 to 3-6 in the IC device 1. A detecting circuit 13 for detecting an overcurrent is shown with only a connection to a switch circuit 12A-1 for simplification of illustration but is also connected to the other switch circuits 12A-2 to 12A-6.

Though the present embodiment handles a three phase load 10, an operation in the case of flowing a U-phase current will be explained by way of example and explanation for the remaining phases will be omitted.

First, the driver circuit 2 outputs first drive signals for causing the upper MOSFET 3-1 in the U-phase and the lower MOSFET 3-4 in the V-phase to turn on. The drive signal for the U-phase is altered by the level shifter 44 so that a reference potential becomes equal to the voltage of a power source 8. The two first drive signals form second drive signals through the switch circuits 12B-1 and 12B-4 turned on or off by an external control signal S' and further through the amplifying means 11-1 and 11-4, in a similar manner to that in the embodiment of FIG. 5. The second drive signals are outputted from the terminals 6-3 and 6-5 to drive the MOSFETs 15-1 and 15-4 to their ON states. If there is no delay between the first and second drive signals, the MOSFETs 3-1, 3-4, 15-1 and 15-4 can operate in a parallel manner. The switch circuits 12B-1, 12B-4, etc. to control the ON/OFF of the second drive signals $I_2$ outputted from the terminals 6 are controlled by a common latch circuit 17.

Since the MOSFETs 15-1 and 15-4 have large current capacities as compared with the MOSFETs 3-1 and 3-4, as has already been mentioned, and are driven by signals passed through the amplifying means, an output current $I_4$ flowing through the MOSFETs 15-1 and 15-4 is large as compared with an output current $I_1$ flowing through the MOSFETs 3-1 and 3-4. The sum of the currents $I_1$ and $I_4$ is supplied to the load 10.

In the case where the current which is needed for the load 10 changes so that the current $I_1$ exceeds the current capacity of the MOSFETs 3-1 and 3-4, the switch circuits 12A-1 and 12A-4 are turned off by a signal from the detecting circuit 13 to turn the MOSFETs 3-1 and 3-4 off, like the embodiment of FIG. 5. At this time, if the current $I_4$ flowing through the MOSFETs 15-1 and 15-4 does not exceed the current capacity of those MOSFETs, the switch circuits 12B-1 and 12B-4 remain the ON states. On the other hand, if the current $I_4$ exceeds the capacity of the MOSFETs 15-1 and 15-4, this condition is detected at the exterior of the IC device 1 so that a control signal S' is inputted to the IC device 1 to turn the switch circuits 12B-1 and 12B-4 off.

In the embodiment shown in FIG. 6, the increase of a current to be supplied to the load has been realized by the parallel connection of the IC device 1 and the MOSFETs of large current capacities having the gates applied with the second drive signals. The increase of the output current can also be realized by the parallel connection of IC devices having the same construction, as is shown by an embodiment of FIG. 7. In the embodiment shown in FIG. 7, the second drive signal $I_2$ outputted from the terminal 6-1 of one IC device 1-1 by a control signal S' is supplied to a driver circuit 2—2 of another IC device 1-2 to operate the device 1-2 in synchronism with the signal $I_2$. As a result, MOSFETs 3-1 and 3-2 forming switch circuits in the respective IC devices can operate in a parallel manner so that the sum of output currents from the respective devices 1-1 and 1-2 is supplied to a load 10.

Figure 7:
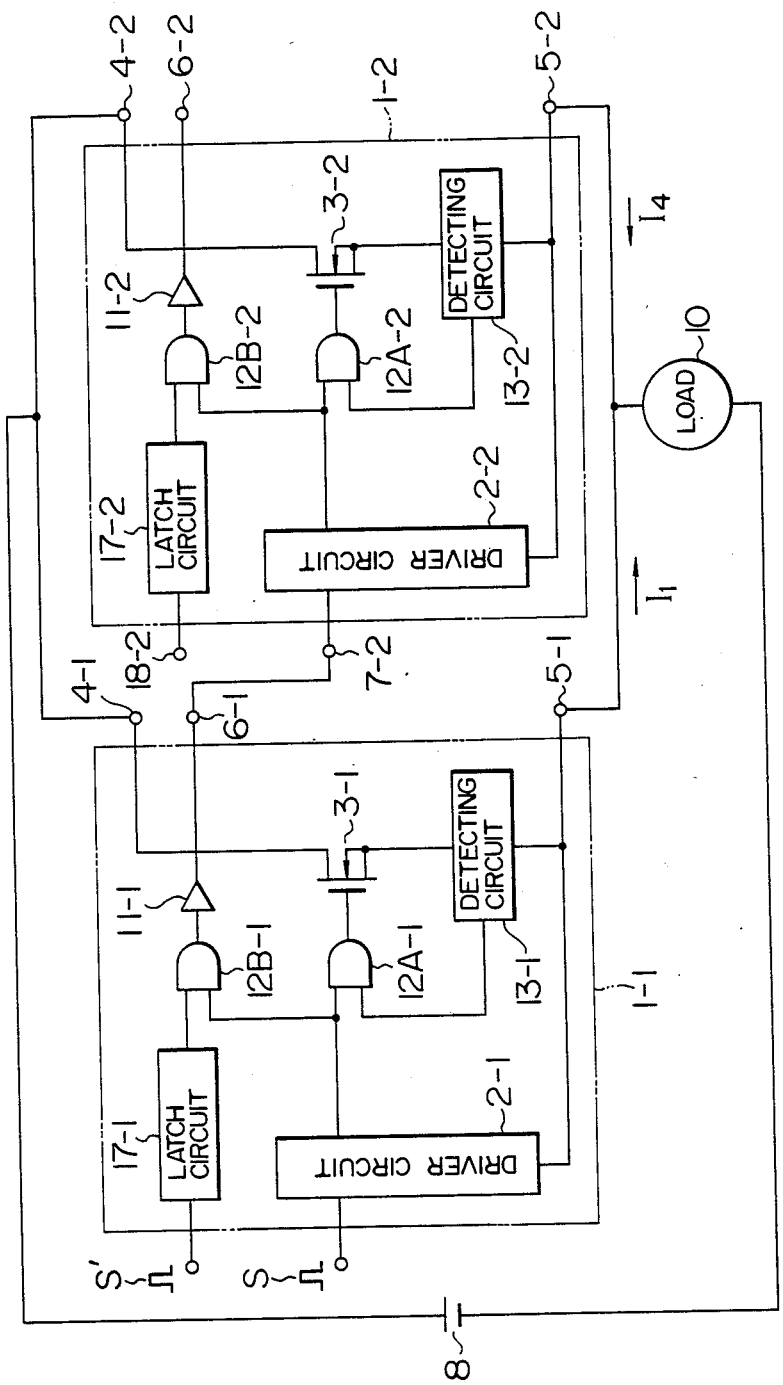

In the parallel connection of an IC device 1 and another semiconductor device in the embodiments shown in FIGS. 6 and 7, the number of the switch circuits 3 constructed by the MOSFETs included in the IC device is the same as that of the MOSFETs included in the other semiconductor device, and the MOSFETs in the IC device and the MOSFETs at the corresponding positions in the other semiconductor device operate in a parallel manner. However, it does not always follow that the number of the MOSFETs in the IC device is the same as that of the MOSFETs in the other semiconductor device.

As has been described above, the IC device 1 has a feature that it functions as not only a switch which supplies the current $I_1$ to the load but also a driver circuit which outputs the second drive signal $I_2$ to the other semiconductor device. If one considers the case where the current $I_1$ is sufficiently small as compared with the current $I_4$ supplied from the other semiconductor device to the load, the IC device 1 may be substantially regarded as acting as only the driver circuit.

Figure 8:
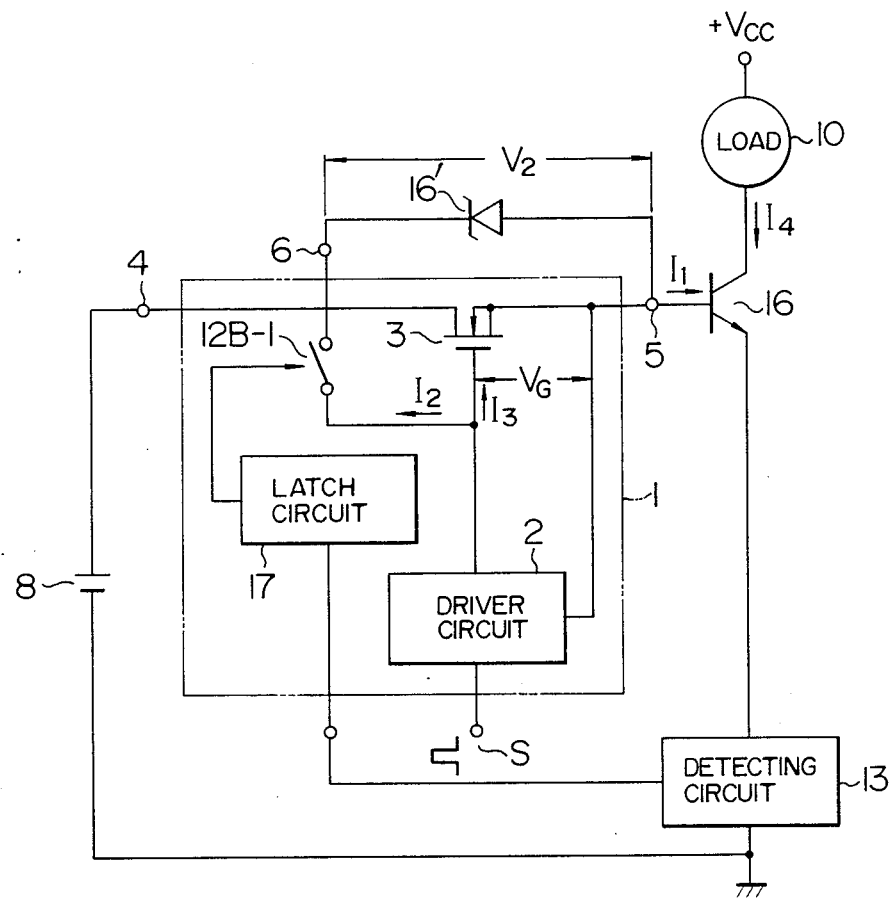

FIG. 8 shows an embodiment in which an IC device 1 is used as a driver circuit for driving the base of a power transistor 16. Referring to FIG. 8, a terminal 4 of the IC device 1 is connected with a positive pole of an external power source 8, a terminal 5 thereof is connected with the base electrode of the power transistor 16, and an MOSFET 3 as a switching means controls a base current of the transistor 16. A zener diode 16' is connected across the terminals 6 and 5. For example, the cathode of the zener diode 16' is connected with the terminal 6 while an anode thereof is connected with the terminal 5, as is shown in FIG. 8. A reverse voltage $V_2$ of the zener diode 16' which becomes constant in the zener characteristic, is selected to be larger than the threshold voltage of the MOSFET 3 but smaller than a drive signal voltage $V_G$ in the ON state of the MOSFET 3 when the potential of the terminal 5 is taken as a reference potential. An external load 10 and an overcurrent detecting circuit 13 are connected between the power transistor 16 and the a negative pole of the external power source 8. In the present embodiment, when an operation is made within an allowed current capacity of the power transistor 16, a switch circuit 12B-1 assumes its OFF state. The driver circuit 2 applies the drive signal voltage $V_G$ to the gate electrode of the MOSFET 3 to turn the MOSFET 3 on, thereby causing the flow of the output current $I_1$. The output current $I_1$ is supplied as a base current to the transistor 16 which in turn is turned on, thereby supplying a current $I_4$ to the load 10.

So long as the current $I_4$ is not an overcurrent, the above-mentioned operation is continued. However, in the case where an overcurrent beyond an allowed current capacity of the transitor 16 or the load 10 occurs for any possible reason, the detecting circuit 13 generates an output signal indicative of the occurrence of the overcurrent and this output signal is applied to a latch circuit 17 to turn the switch circuit 12B-1 on. As a result, the gate voltage of the MOSFET 3 is clamped to the constant voltage $V_2$ of the zener diode 16' so that the base current $I_1$ of the transistor 16 is reduced and hence the current $I_4$ supplied to the load 10 is reduced. Thereafter, if a factor of the occurrence o of the overcurrent is eliminated, the switch circuit 12B-1 is returned to the OFF state to increase the current $I_4$ up to a usual level. A circuit means for supplying the second drive signal $I_2$ to the third terminal 6 includes the switch circuit 12B-1, an electrical conductor for interconnecting the switch circuit 12B-1 and the output line of the driver circuit 2, and an electrical conductor for interconnecting the switch circuit 12B-1 and the terminal 6.

Thus, in the present embodiment, the zener diode 16' connected across the second and third terminals 5 and 6 can be used for the purpose of clamping the drive signal voltage for the MOSFET 3.

We claim:

1. A monolithic integrated circuit device comprising:
   first and second output terminals;
   switching means having first and second main electrodes and a control electrode, said first and second main electrodes being connected with said first and second output terminals, respectively, so that said switching means is connected across said first and second output terminals, said first and second output terminals being connectable with an external load and an external power source so as to form a closed circuit along with said switching means;
   driving means for generating a first drive signal in response to an externally applied control signal, the output of said driving means being electrically connected with the control electrode of said switching means for supply of said first drive signal to said switching means so that said switching means selectively passes therethrough, in response to said first drive signal, an output current to be supplied to said external load from said external power source;

a third output terminal; and circuit means for electrically interconnecting said third output terminal and said driving means for derivation of electric energy from said driving means as a second drive signal for supply of said second drive signal to an external circuit via said third output terminal, said second drive signal being in phase with said first drive signal and having small energy as compared with that of said output current flowing through said switching means.

2. A device according to claim 1, in which said driving means includes first and second driving circuits for generating said first and second drive signals, respectively, the output of said first driving circuit being connected with the control electrode of said switching means, and said circuit means includes an electrical conductor for interconnecting the output of said second driving circuit and said third output terminal.

3. A device according to claim 1, in which said driving means includes a driver circuit for generating a common drive signal, the output of said driver circuit being connected with the control electrode of said switching means and with said circuit means so that said common drive signal is supplied to said control electrode of said switching means as said first drive signal and is also supplied through said circuit means to said third output terminal as said second drive signal.

4. A device according to claim 3, in which a first switch circuit is provided between the output of said driver circuit and the control electrode of said switching means, and said circuit means further includes a second switch circuit provided between the output of said driver circuit and said third output terminal, said first and second switch circuits being controllable independently from each other.

5. A device according to claim 4, in which means is provided for detecting occurrence of an overcurrent in a circuit path which circuit path includes said first and second output terminals and said first and second main electrodes of said switching means and allows said output current to flow therethrough, said detecting means generating, upon detection of occurrence of an overcurrent in said circuit path, a switch-open signal to be fed to open said first switch circuit to stop flow of said output current.

6. A device according to claim 5, in which said overcurrent detecting means is a circuit provided in said circuit path for detecting occurrence of an overcurrent therein.

7. A device according to claim 5, in which said overcurrent detecting means is a circuit provided in the vicinity of said switching means for sensing heat generated by said switching means, thereby detecting occurrence of an overcurrent in said circuit path.

8. A monolithic integrated circuit device comprising:
first and second output terminals;
switching means having first and second main electrodes and a control electrode, said first and second main electrodes being connected with said first and second output terminals, respectively, so that said switching means is connected across said first and second output terminals, said first and second output terminals being connectable with an external load and an external power source so as to form a closed circuit along with said switching means;

driving means for generating a first drive signal in response to an externally applied control signal, the output of said driving means being electrically connected with the control electrode of said switching means for supply of said first drive signal to said switching means so that said switching means selectively passes therethrough, in response to said first drive signal, an output current to be supplied to said external load from said external power source;

a third output terminal; and circuit means electrically interconnected between said third output terminal and said driving means for derivation of electric energy from said driving means as a second drive signal for supply of said second drive signal to an external circuit via said third output terminal, said second drive signal having small energy as compared with that of said output current flowing through said switching means.

9. A device according to claim 8, in which at least one of the blocking voltage and the current capacity of said driving means is lower than that of said switching means.

10. A power conversion apparatus comprising:
a power switching device for supplying therethrough power from a first power source to a load;
sensor means for detecting occurrence of an overcurrent in a circuit path which circuit path includes said power switching device, said sensor means generating a sense signal upon detection of occurrence of an overcurrent current in said circuit path;
a monolithic integrated circuit device including
first and second output terminals,
switching means having first and second main electrodes and a control electrode, said first and second main electrodes being connected with said first and second output terminals, respectively, so that said switching means is connected across said first and second output terminals, said first and second output terminals being connectable with a second power source and said power switching device, respectively, so as to form a closed circuit along with said switching means,
a driver circuit for generating a common drive signal, in response to an externally applied control signal, the output of said driver circuit being connected with the control electrode of said switching means so that said common drive signal is supplied to said control electrode of said switching means as a first drive signal to selectively pass through said switching means, in response to said first drive signal, an output current to be supplied to said power switching device from said second power source,
a third output terminal, and
circuit means for electrically interconnecting said third output terminal and said driver circuit so that said common drive signal is also supplied through said circuit means to said third output terminal as a second drive signal, said second drive signal being in phase with said first drive signal and having small energy as compared with that of said output current flowing through said switching means, said circuit means including a switch circuit between the output of said driver circuit and said third output terminal, said switch circuit being arranged so as to be closed in response to said sense signal from said sensor means thereby to supply said second drive signal to said third output terminal; and a zener diode connected across said third and second output terminals to receive said second drive signal to limit the voltage difference between the control electrode and the second main electrode of said switching means to a predetermined value when an overcurrent in said circuit path occurs.

* * * * *